United States Patent [19]

Reynolds et al.

[11] Patent Number: 4,719,317
[45] Date of Patent: Jan. 12, 1988

[54] FILM-TYPE ELECTRICAL ELEMENT AND CONNECTION WIRE COMBINATION AND METHOD OF CONNECTION

[75] Inventors: Quentin Reynolds, Worplesdon, Great Britain; Karl Deckelmann, Aschaffenburg, Fed. Rep. of Germany

[73] Assignee: W. C. Heraeus GmbH, Hanau, Fed. Rep. of Germany

[21] Appl. No.: 840,923

[22] Filed: Mar. 18, 1986

[30] Foreign Application Priority Data

Apr. 3, 1985 [DE] Fed. Rep. of Germany ....... 3512158

[51] Int. Cl.$^4$ .............................................. H01R 4/04
[52] U.S. Cl. .................................. 174/94 R; 228/122; 338/322; 338/329
[58] Field of Search ............... 228/248, 122, 123, 124, 228/179; 174/94 R; 428/432; 338/309, 322, 329; 339/275 C; 252/512, 514; 501/61, 75; 403/179, 270

[56] References Cited

U.S. PATENT DOCUMENTS

| | | | |
|---|---|---|---|
| 2,489,409 | 11/1949 | Green et al. | 338/322 X |
| 3,818,118 | 6/1974 | Bennett et al. | 338/329 X |
| 3,827,891 | 8/1974 | Larry | 252/514 X |
| 3,897,624 | 8/1975 | Hamano | 228/122 |
| 4,028,657 | 6/1977 | Reichelt | 338/309 X |
| 4,129,848 | 12/1978 | Frank et al. | 338/309 X |
| 4,459,166 | 7/1984 | Dietz et al. | 501/75 X |
| 4,532,075 | 7/1985 | Taylor | 252/514 |

FOREIGN PATENT DOCUMENTS

| | | | |
|---|---|---|---|
| 655493 | 1/1963 | Canada | 338/210 |
| 27214 | 9/1975 | Japan | 338/329 |
| 1532908 | 11/1978 | United Kingdom . | |

Primary Examiner—Morris H. Nimmo
Attorney, Agent, or Firm—Frishauf, Holtz, Goodman & Woodward

[57] ABSTRACT

To form a sturdy, environmentally essentially unaffected and high-temperature resistance electrical connection between a connection wire (4) and a conductive track (2) on the substrate (1), a portion of the wire (4) is embedded in a unitary bonding element (3). The bonding element comprises about 70% of metal particles and 30% of glass particles to form a bonding spot. The bonding spot is made by applying a paste of glass and platinum powder, with the glass powder having a grain size several times larger than the platinum powder on the conductive track (2), pressing the end portion of the connection wire (4) into the spot so that the wire will be completely surrounded, and then firing the bonding spot. If the conductive track (2) is applied by film technology, firing of the conductive track (2) and of the bonding spot (3) can be carried out in a single operating step. Preferably, the conductive track and the bonding spot (3), as well as the connecting wire (4), have temperature coefficient-compatible components which, preferably, are similar or the same. The conductive track may be a temperature raising resistor (R).

34 Claims, 2 Drawing Figures

FILM-TYPE ELECTRICAL ELEMENT AND CONNECTION WIRE COMBINATION AND METHOD OF CONNECTION

Reference to related patent, assigned to the Assignee of the present application:
British No. 1,532,908 to which German No. 26 15 473 corresponds.

The present invention relates to an electrical film-type element, such as a thermally responsive resistor applied by thick-film technology to a substrate, and more particularly to the connection arrangement for such a resistor.

BACKGROUND

Various types of electrical elements, applied by film technology and, especially by thick-film technology on the substrate, require a connecting wire to a conductive track formed on the substrate, such as a printed circuit or the like. The connecting point between the wire and the electrically conductive track, or other electrically conductive region on the substrate, can be covered with a protective element such as a glass-type material.

A thick-film temperature measuring resistor, applied to a substrate, is known and described in the prior art, for example in the referenced British patent specification No. 1,532,908, assigned to the Assignee of the present application. The measuring resistor there disclosed is applied to a ceramic substrate on which the resistance layer, which includes, or is entirely made of platinum, is applied. The resistance layer is electrically connected to a connecting electrode which is, in turn, electrically connected with a conductive track on the substrate by a bonding spot. The bonding spot is electrically and mechanically connected by thermal compression welding. The arrangement performs a good electrically conductive connection. It is then coated with an electrically insulating paste formed of a glaze mass, which contains ceramic components. The glazing mass provides for insulation and, further, ensures a reliable, mechanically sturdy connection.

THE INVENTION

It is an object to provide an electrical film-type element, a connection to a substrate, and a method of forming the connection, in which the contacting or bonding spot between the conductive track and the connecting wire is extremely sturdy and has a long-time holding connection and which, further, is capable of withstanding high working and operating temperatures and can be made cheaply in a single working step.

Briefly, the bonding connection is formed by a unitary element of metal particles and glass particles, in which the metal particles ensure electrical connection between the conductive track and the connecting wire, the mass being bonded to the conductive track, and embedding and surrounding, at least in part, the end portion of the connecting wire. The electrically conductive material in the bonding spot, and the bonding spot itself are made of the same material, namely the composite of metallic particles and glass particles. This arrangement permits an inexpensively made connection between a conductive track and an electrical element, such as a film-type structure on a substrate, from which a connecting wire emanates.

In accordance with a feature of the invention, a paste of glass particles and metallic particles is applied at the bonding spot in the form of a paste dot; the bonding wire is pressed into the paste dot so that the paste will completely surround the bonding wire and the paste, with the bonding wire pressed thereinto, is fired, so that the final electrical connection will be a fired mass of glass and metal particles with the bonding wire securely retained and embedded therein.

The glass particles can be suitably selected so that they can accept high operating temperatures which may be above 600° C. The mass which forms the electrically conductive connection between the track and the connecting wire simultaneously forms a mechanically reliable connection without further additional materials.

DRAWING

FIG. 1 is a longitudinal schematic sectional view through an electrical connection formed in accordance with the present invention; and FIG. 2 is a top view of a resistance thermometer made in accordance with the invention.

DETAILED DESCRIPTION

Figure 1:
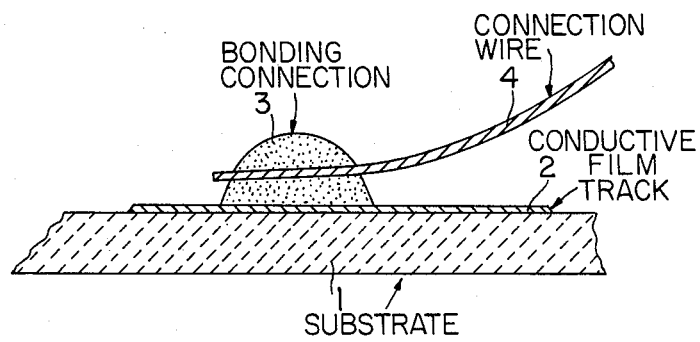

A substrate 1 has a conductive track 2 applied thereto, for example to the upper surface thereof. A bonding spot, forming a soldering or connecting spot 3 is applied to the conductive track 2 in the region where the contact is to be maintained. The bonding or soldering spot 3 has metallic particles therein. The end portion of the connecting wire 4 is embedded in the bonding spot. The terminal end of the connecting wire 4 may slightly extend from the mass 3. This arrangement ensures reliable embedding of the connecting wire 4 and the mass 3 and facilitates inspection.

The mass 3 includes metallic particles and glass particles. To ensure good conductivity of the mass 3, the metallic particles, in the form of metal powder, should be present in about 40 to 80%, preferably in the range of about 70% of the mass when it has been fired. In the description, unless it appears otherwise, all percentages will be by weight. The metallic particles, preferably, are present in the form of platinum powder, or a powder made of a platinum alloy. Excellent results were obtained by utilizing an average grain size of from 1.5 to 5 micrometers, preferably in the order of about 2 micrometers. The glass component of the mass 3 is formed by about 50% PbO, about 10% $B_2O_3$ and about 40% $SiO_2$. A mass of this type has a high softening point, so that the temperature measuring resistor, and the connection thereto can be operated at working temperatures which are above 600° C. Increasing the proportion of lead oxide and boron oxide lowers the softening point of the fired mass; adding silicon dioxide and aluminum oxide increases the softening point, as well as the toughness and the water-resistance of the glass. The entire mass can be applied by screen printing, or spraying. A solvent is added to the mass being applied. Independence on the temperature characteristics required from the bonding spot, that is, the level of the softening temperature, the respective solvent or screen printing oil can also be changed. By suitable selection—as well known—organic components will reliably evaporate before the glass melts. Otherwise, porous bonding layers may result which have a low holding strength. Minor additives of ethyl cellulose, terpineol, and dibutylphthalate results in a highly viscous thixotropic paste, which can readily be handled by spraying; spraying is one form of application of the paste to the bonding spot.

A particularly suitable mass is obtained by using glass particles of average grain size of between 5 to 50 micrometers, preferably in the range of about 8 micrometers. The metallic particles which should have a grain size less than the grain size of the glass particles thus will so surround the glass particles that the paste will be highly conductive which, further, has high mechanical strength.

In accordance with the feature of the invention, the electrical element or component is made this way: a conductive track 2 is applied to a substrate 1 in accordance with any well-known and suitable technology. The mass 3, in paste form, is applied to the bonding spot on the conductive track 2. The end portion of the connecting wire 4 is pressed into the bonding spot mass in such a way that the mass completely surrounds the connecting wire 4. Thereafter, the mass is fired. The connecting wire should be so embedded in the mass 3 that the end portion of the connecting wire is completely surrounded, at least in part over its length. Permitting the terminal end of the connecting wire 4 to slightly project from the bonding spot ensures that the connecting wire is well inserted in the mass 3 and thereby held reliably therein.

The conductive track 2, preferably, utilizes a thick-film paste which can be fired with the thick-film paste formed by the bonding spot 3 at the same time, that is, in a single working step. In accordance with a preferred feature of the invention, the material for the conductive track 2 and the material for the mass 3 may be a paste which, in essence, has the same, or very similar composition. If so, the conductive track 2 and the mass 3 for the bonding point can be applied to the substrate 1 in a single working step.

EXAMPLE

Figure 2:
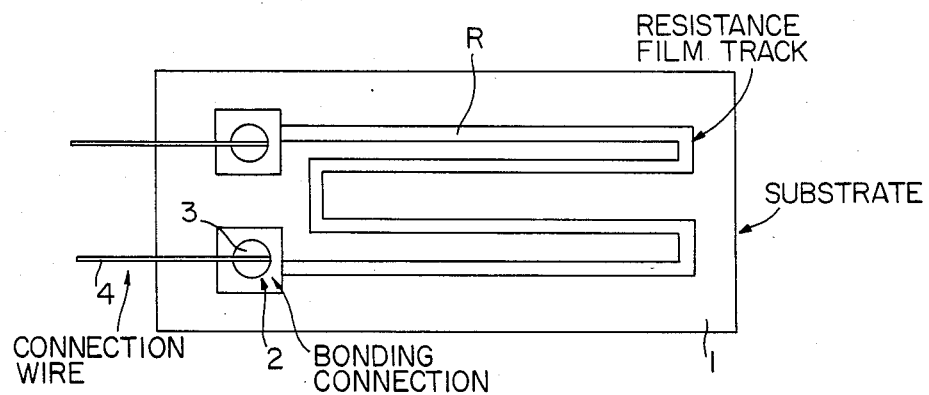

A measuring resistor for a resistance thermometer is made this way: the measuring resistor R (FIG. 2) is applied to the substrate in thick-film technology. The measuring resistor R has its connecting wire 4, for example of platinum, connected thereto. The connecting wire 4 is then connected to the conductive track 2 by a bonding spot of the following composition:

| | |
|---|---|
| platinum powder | 62% |
| average grain size 2.1 micrometer | |
| surface 1.2 m$^2$/g | |
| glass powder (lead-boron-silicate) | 26.4% |
| average grain size 8 micrometers | |
| ethyl cellulose | 1.8% |
| terpineol | 8 |
| dibutylphthalate | 1.8% |

(all percentages by weight)

The square surface of the platinum powder was measured according to the BET method with an area AREA meter number 6500 made by the Stroehlein Company, Duesseldorf, Fed. Rep. Germany. An absorption vessel, with the sample of the platinum powder and a comparison vessel, both vessels being of glass and of equal volume, were filled with nitrogen and, at room temperature, at the same pressure, namely atmospheric pressure. Thereafter, both vessels were chilled to the temperature of liquid nitrogen. The adsorption of the nitrogen on the sample causes a pressure difference between the comparison vessel and the vessel containing the sample, due to the adsorption. By measuring the pressure difference of the adsorbed nitrogen quantity with respect to the comparison vessel, it is possible to determine the surface of the powder sample.

A mixture of terpineol and dibutylphthalate has ethyl cellulose dissolved therein under continuous intensive stirring, at a temperature of about 50° C. The glass powder is first added to the so made oil under continuous further stirring; then the metal powder is added, and the glass and metal powders are worked into the mass. The result will be a highly viscous thixotropic paste, which is capable of handling and working by spraying.

The bonding spot is applied by spraying; it can also be applied by screen printing. The platinum wire 4 is pressed into the bonding spot. The substrate 1 with the bonding spot 3 is applied to the conductive track 2 and the wire 4 pressed therein is fired in a tunnel oven during a pass time of 55 minutes from 100° C. of the burn out zone to 100° C. to the cooling zone. The tunnel oven has a peak temperature of 850° C. The peak temperature of 850° C. was holded in the oven or furnace during nine minutes. In other words, the substrate 1 was exposed to the temperature of 850° C. during nine minutes, while passing trough the oven.

After firing, the mass 3 had 70.1% platinum and 29.9% glass (by weight).

The measuring resistor R has a maximum working temperature of 600° C. The transition resistance was less than 1 Ohm at 25° C.

Test of the bonding connection: the bonding connection was subjected to 1,500 cycles of heating to 500° C. and cooling; upon cooling, the bonding spot had a temperature of between 200° C. to about 300° C. No failures were observed.

The contacting connection is particularly suitable for forming electrical contacts with small heating elements, sensors, and the like.

Diffusion problems and changes of a possibly desired temperature coefficient can be avoided by matching the type of metal and the metal particles in the bonding spot to the type of metal of the metallizing of the conductive track 2. Preferably, the bonding spot will be formed with platinum powder or platinum particles as the metal component and the connecting wire 4, preferably, also is platinum. The conductive track 2 may also include platinum, or platinum-type metals, or other materials which have temperature coefficients which are reasonably compatible with the bonding spot 3.

The percentages given by weight in the claims for the glass and metal components relate to the formation of the paste after firing, that is, without the solvent forming the volatile components of a paste which can be applied to the substrate 1.

Suitable further additives to the glass are CaO and/or aluminum oxide and/or MgO, for example in quantities of up to about 8% by weight calcium oxide and up to 6% by weight of aluminum oxide—with respect to the glass mass. The effect of these additives is: Increase of softening point and viscosity of the glass. The durability against water and low concentrations of acid sulutions is increased.

A preferred metal for the metal particles, as well as for the connection wire 4 is platinum, because it has the same TCR (termal coefficient of resistivity) as the platinum wire and platinum conductor pattern. Without detracting substantially from the advantages of platinum, other materials of lesser cost, for example platinum alloys, silver/palladium alloys, palladium, gold/platinum alloys, copper, nickel, copper/nickel alloys, brass, tantalum, nickel/chrome, can be used. Suitable platinum alloys are especially silver/platinum. Substituting platinum alloys for platinum results in: The working temperature of the sensor is lower as 400° C.; at this temperature Ag-migration is starting into the platinum-layer of the sensor and lower than the TCR. Other suitable metals or metal alloys are, for example, rhodium or rhodium alloys.

A suitable substrate 1 is aluminum oxide; other substrates can be made out of ceramics and insulated steel or steatite, aluminum nitride.

An entire resistance thermometer, or high-temperature coefficient resistor can be made by applying a thick-film strip of resistance thermometer material, for example as described in British specification No. 1,501,959, to which U.S. Pat. No. 4,028,657 corresponds, by applying, in thick-film technology, a paste in a suitable pattern on the substrate, applying by thick-film technology the conductive tracks in the form of a paste and placing the connecting wires in suitable bonding spots formed on the conductive tracks 2. The entire subassembly, then, can be fired or sintered so that, in one working step, the resistance thermometer and the connections and conductive tracks are formed, bonded by sintering to the substrate and further forming the connections between the connecting wire 4 and the conductive tracks 2. These connections will be environmentally stable due to the presence of the glass particles, yet electrically conductive since the metal particles in the paste, prior to firing, are much smaller than the glass particles, thereby forming a continuous conductive glaze which establishes, at the same time, electrical connection to the connection wire 4.

We claim:
1. Electrical or electronic component having
   a substrate (1) having an essentially insulating surface;
   a film-type conductive track (2) in layer form of conductive material (2) applied to the insulating substrate (1);
   a connection wire (4); and
   further comprising a unitary mechanical and electrical bonding connection (3) between the conductive track (2) and the connection wire (4),
   which bonding connection is characterized by
   a unitary element (3) of electrically conductive metal particles and glass particles,
   wherein the metal particles ensure electrical connection between the conductive track (2) and the connection wire (4),
   said unitary element (3) being bonded to the conductive track (2)
   wherein at least in part, an end portion of said connection wire (4) is surrounded by and embedded in said unitary element; and
   wherein the metal particles comprise metal powder present in between 40 to 80% (by weight) of the unitary element (3).
2. Component according to claim 1, wherein the metal powder is present in between about 50 to 75%.
3. Component according to claim 2, wherein the metal powder is present in about 70%.
4. Component according to claim 1, wherein the metal powder comprises a powder of platinum, or of a platinum alloy.
5. Component according to claim 1, wherein the metal powder has an average grain size of between about 1.5 to 5 micrometers.
6. Component according to claim 2, wherein the metal powder has an average grain size of about 2 micrometers.
7. Component according to claim 1, wherein the glass particles comprise lead-boron-silicate glass.
8. Component according to claim 7, wherein the glass particles comprise
   PbO—40 to 90%
   $B_2O_3$—5 to 20%
   $SiO_2$—5 to 55%
   (all percentages by weight).
9. Component according to claim 8, wherein the glass particles comprise
   PbO—45 to 60%
   $B_2O_3$—7 to 15%
   $SiO_2$—30 to 45%.
10. Component according to claim 9, wherein the glass particles comprise
    PbO—about 50%
    $B_2O_3$—about 10%
    $SiO_2$—about 40%.
11. Component according to claim 7, wherein the glass particles further comprise at least one of:
    CaO—up to 8%
    $Al_2O_3$—up to 6%.
12. Component according to claim 1, wherein the glass particles have a grain size of between about 3 to 50 micrometers.
13. Component according to claim 12, wherein the glass particles have a grain size of 5 to 30 micrometers.
14. Component according to claim 6, wherein the glass particles have a grain size of about 8 micrometers.
15. Component according to claim 1, wherein the unitary element (3) comprises the residue of a paste formed by said metal particles and glass particles and a solvent comprising
    ethyl cellulose—about 1.8%
    terpineol—about 8%
    dibutylphthalate—about 1.8%
    all percentages by weight of the entire paste prior to firing, said paste having been fired at a temperature in excess of the vaporization temperature of said solvent.
16. Component according to claim 1, wherein said unitary element (3) comprises the residue of a paste formed by about 62% metal particles;
    about 26.4% glass particles, said glass particles comprising about 50% PbO, about 10% $B_2O_3$ and about 40% $SiO_2$;
    and the remainder formed by a solvent, said solvent comprising
    about 1.8% ethyl cellulose, about 8% terpineol and about 1.8% dibutylphthalate
    all percentages by weight and before evaporation of the solvent upon firing.
17. Component according to claim 1, wherein the average diammetrical particle or grain size of the glass particles is at least several times as great as the grain size of the metal particles to provide for association of a plurality of metal particles with any one glass particle.
18. Electrical or electronic component having
    a substrate having an essentially insulating surface;
    a film-type conductive track (2) in layer form of conductive material applied to the insulating surface of the substrate (1);
    a connection wire (4) and
    comprising a unitary and electrical bonding connection between the conductive track (2) and the connection wire, which bonding connection is charac- terized by a unitary element comprising the residue of a paste formed by metal particles which ensure electrical connection between the conductive track (2) and the connection wire (4) and glass particles, and a solvent, which residue occurs after firing of said paste and evaporation of the solvent, said unitary element being bonded to the conductive track and, at least in part, embedding and surrounding an end portion of said connection wire within said unitary element; and wherein the metal particles comprise metal powder present in between 40 to 80% (by weight) of the unitary element (3).

19. The electrical or electronic component of claim 18, wherein said film-type conductive track and the paste forming said unitary element are of essentially the same composition and are being bonded together by simultaneous firing in one firing step.

20. Electrical or electronic component having
a substrate (1) having an essentially insulating surface;
a film-type conductive track (2) in layer form of conductive material (2) applied to the insulating substrate (1);
a connection wire (4); and
further comprising a unitary mechanical and electrical bonding connection (3) between the conductive track (2) and the connection wire (4),
which bonding connection is characterized by
a unitary element (3) of electrically conductive metal particles and glass particles,
wherein the metal particles ensure electrical connection between the conductive track (2) and the connection wire (4),
said unitary element (3) being bonded to the conductive track (2)
wherein at least in part, an end portion of said connection wire (4) is surrounded by and embedded in said unitary element; and
wherein the metal powder comprises a powder of platinum, or of a platinum alloy.

21. Electrical or electronic component having a substrate (1) having an essentially insulating surface;
a film-type conductive track (2) in layer form of conductive material (2) applied to the insulating substrate (1);
a connection wire (4); and
further comprising a unitary mechanical and electrical bonding connection (3) between the conductive track (2) and the connection wire (4),
which bonding connection is characterized by
a unitary element (3) of electrically conductive metal particles and glass particles,
wherein the metal particles ensure electrical connection between the conductive track (2) and the connection wire (4),
said unitary element (3) being bonded to the conductive track (2)
wherein at least in part, an end portion of said connection wire (4) is surrounded by and embedded in said unitary element; and
wherein the metal powder has an average grain size of between about 1.5 to 5 micrometers.

22. Electrical or electronic component having a substrate (1) having an essentially insulating surface;
a film-type conductive track (2) in layer form of conductive material (2) applied to the insulating substrate (1);
a connection wire (4); and further comprising a unitary mechanical and electrical bonding connection (3) between the conductive track (2) and the connection wire (4),
which bonding connection is characterized by
a unitary element (3) of electrically conductive metal particles and glass particles,
wherein the metal particles ensure electrical connection between the conductive track (2) and the connection wire (4),
said unitary element (3) being bonded to the conductive track (2)
wherein at least in part, an end portion of said connection wire (4) is surrounded by and embedded in said unitary element; and
wherein the glass particles comprise lead-boron-silicate glass.

23. Component according to claim 22, wherein the glass particles comprise
PbO—40 to 90%
$B_2O_3$—5 to 20%
$SiO_2$—5 to 55%
(all percentages by weight).

24. Component according to claim 22, wherein the glass particles comprise
PbO—45 to 60%
$B_2O_3$—7 to 15%
$SiO_2$—30 to 45%.

25. Component according to claim 22, wherein the glass particles comprise
PbO—about 50%
$B_2O_3$—about 10%
$SiO_2$—about 40%.

26. Component according to claim 22, wherein the glass particles further comprise at least one of:
CaO—up to 8%
$Al_2O_3$—up to 6%.

27. Component according to claim 22, wherein the glass particles have a grain size of between about 3 to 50 micrometers.

28. Component according to claim 22, wherein the glass particles have a grain size of 5 to 30 micrometers.

29. Component according to claim 22, wherein the glass particles have a grain size of about 8 micrometers.

30. Component according to claim 22, wherein the unitary element (3) comprises the residue of a paste formed by said metal particles and glass particles and a solvent comprising
ethyl cellulose—about 1.8%
terpineol—about 8%
dibutylphthalate—about 1.8%
all percentages by weight of the entire paste prior to firing, said paste having been fired at a temperature in excess of the vaporization temperature of said solvent.

31. Component according to claim 22, wherein said unitary element (3) comprises the residue of a paste formed by about 62% metal particles;
about 26.4% glass particles, said glass particles comprising about 50% PbO, about 10% $B_2O_3$ and about 40% $SiO_2$;
and the remainder formed by a solvent, said solvent comprising
about 1.8% ethyl cellulose, about 8% terpineol and about 1.8% dibutylphthalate
all percentages by weight and before evaporation of the solvent upon firing.

32. Component according to claim 22, wherein the average diammetrical particle or grain size of the glass particles is at least several times as great as the grain size of the metal particles to provide for association of a plurality of metal particles with any one glass particle.

33. The electrical or electronic component of claim 19 wherein the average diametrical particle or grain size of the glass particles is at least several times as great as the grain size of the metal particles to provide for association of a plurality of metal particles with any one glass particle.

34. The electrical or electronic component of claim 33 wherein the metal powder is present in between about 50 to 75%, and has an average grain size of between about 1.5 to 5 micrometers.

* * * * *